United States Patent [19]

Betzl et al.

[11] 4,430,629
[45] Feb. 7, 1984

[54] ELECTRICAL FILTER CIRCUIT OPERATED WITH A DEFINITE SAMPLING AND CLOCK FREQUENCY $F_T$ WHICH CONSISTS OF CTD ELEMENTS

[75] Inventors: Hermann Betzl; Johann Magerl, both of Munich; Wilhelm Volejnik, Sauerlach, all of Fed. Rep. of Germany

[73] Assignee: Siemens Aktiengesellschaft, Berlin & Munich, Fed. Rep. of Germany

[21] Appl. No.: 252,058

[22] Filed: Apr. 8, 1981

[30] Foreign Application Priority Data

Apr. 25, 1980 [DE] Fed. Rep. of Germany ....... 3016082

[51] Int. Cl.³ .................... H03H 15/02; H03H 17/06; H03H 7/00
[52] U.S. Cl. .................................. 333/165; 328/151; 333/166; 333/175; 377/59
[58] Field of Search ............... 333/165, 166, 167, 175; 307/221 D; 357/24; 328/151, 167; 377/57–62

[56] References Cited

U.S. PATENT DOCUMENTS

| 4,281,296 | 7/1981 | Betzl et al. | 333/165 |
| 4,281,297 | 7/1981 | Betzl et al. | 333/165 |
| 4,393,356 | 7/1983 | Kuenemund | 333/165 |

FOREIGN PATENT DOCUMENTS 2555835 6/1977 Fed. Rep. of Germany ...... 333/165

*Primary Examiner*—Marvin L. Nussbaum

[57] ABSTRACT

The invention relates to an electrical filter circuit operated with a definite sampling and clock frequency $f_T$, such filter being made up of CTD elements, and having at least one bipolar or quadripolar resonator in the form of a self-contained conductor loop (for example, $C_1$, $C_2$) with unidirectional transmission behavior.

Differences in the transfer capacitances of such circuits are reduced, as far as possible, in order to thereby simplify integrated manufacture as far as possible, by positioning the frequency band to be filtered out at a frequency position which lies above half the clock frequency ($f_T/2$), or in the range from $f_T/2$ through $3f_T/2$.

1 Claim, 2 Drawing Figures

ELECTRICAL FILTER CIRCUIT OPERATED WITH A DEFINITE SAMPLING AND CLOCK FREQUENCY $F_T$ WHICH CONSISTS OF CTD ELEMENTS

BACKGROUND OF THE INVENTION

1. Field of the Invention

The invention relates to an electrical filter circuit, operated with a definite sampling and clock frequency $f_T$, made up of CTD elements and incorporating at least one bipolar or quadripole resonator in the form of a self-contained conductor loop with unidirectional transmission behavior.

2. The Prior Art

Filter circuits and resonator circuits of the above type in the form of one port or two port resonators have already become known from the copending applications of Friedrich Kuenemund, Serial No. 630,932, filed Nov. 11, 1975, now abandoned, and Serial No. 151,772, filed May 21, 1980, now U.S. Pat. No. 4,393,356. The disclosure of the Kuenemund patent is incorporated hereinto by reference. It is described in that patent that so-called BBD arrangements (bucket brigade devices) so-called CCD arrangements (charge coupled devices) are to be understood by CTD lines. CCD circuits are such devices as function according to the principle of coupled charges. The designation "CTD device" (charge transfer devices) has become standard as a superordinate term for these two types of circuits and it is characteristic of said CTD lines that they consist of a greater plurality, thus, for example, n individual CTD elements which can be realized as fully integratable overall arrangements. As is known, such CTD arrangements must be operated via a clock signal with a predetermined clock frequency $f_T$, with the clock signal being supplied to the individual transfer capacitors. In practice, so-called multi-phase CTD arrangements are preferred, their clock signals being phase-shifted with respect to one another in such manner that neighboring transfer capacitances are driven with phase-shifted clocks. If one employs a so-called p-phase clock system (p=2, 3, 4 ...), then one CTD element consists of p neighboring transfer capacitances. Details concerning this may be found, for example, in the book "Charge Transfer Devices", Academic Press Inc., New York, San Francisco, London 1975. Circuit possibilities are also cited in said book and in the other publications which have been referred to as to how signals for the further processing in a CTD arrangement can be edited or, how signals transmitted via CTD arrangements can be reconverted into other signal forms, such as analog signals. In the German Letters Patent already cited, filter circuits are specified in which such CTD lines are wired into a self-contained ring capable of resonance, whereby the resonant frequency of said rings is directly determined by the plurality n of the CTD line elements employed for the self-contained conductor loop and the clock frequency. Codeterminate for the filter characteristic is the ratio of the transfer capacitances of the CTD arrangement employed in the output line to the transfer capacitance of the CTD arrangement employed in the closed conductor loop. The arrangement illustrated and described in the Kuenemund patent incorporates a plurality of CTD lines, each having plural storage cells and interconnected so as to have unidirectional transmission behavior, with one of the CTD lines connected as a closed loop to serve as a resonator.

CTD filter circuits according to the Letters Patent cited above with a plurality of bipolar or quadripolar resonators connected in a series have high values for the capacitance ratios in the bipolar or quadripolar resonator, given band pass circuits with the relatively small pass band: $B = \Delta f_{3\,db}/f_m < 1\%$.

Thus, the transfer capacitances for the feeder or, respectively, tap lines differ relatively greatly from the transfer capacitances of the CTD lines to be employed in the closed conductor loops.

SUMMARY OF THE INVENTION

In order to simplify the technological processes as far as possible for integrated manufacture, the principal object of the invention is to reduce differences in the transfer capacitances of the CTD lines to be employed.

This object is achieved in such a manner that the frequency band to be filtered out has a frequency position lying above half the clock frequency ($f_T/2$).

These and other features and advantages will become manifest from a review of the following description and the accompanying drawings.

BRIEF DESCRIPTION OF THE DRAWINGS

In the following, reference is made to the accompanying drawings in which.

DESCRIPTION OF THE PREFERRED EMBODIMENTS

Figure 1:
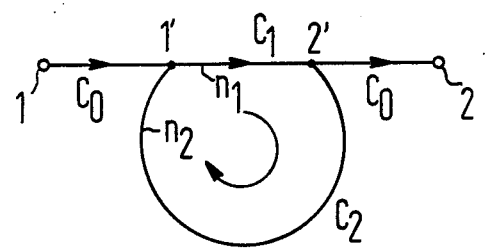
FIG. 1 illustrates a known embodiment of a CTD filter.

For the purposes of easier comprehension, the basic design of a CTD filter circuit, using a bipolar resonator, is shown in FIG. 1 according to the prior art patents which have been referred to. The input and the output of the filter circuit are indicated respectively with the reference numerals 1 and 2; the CTD input line or, respectively, the CTD output line has the transfer capacitance $C_0$. A self-contained conductor loop which consists of a first section with the transfer capacitance $C_1$ and a section with the transfer capacitance $C_2$ is connected to points 1' and 2'. The unidirectional transmission behavior of the CTD line is identified by means of the arrows.

Instead of the bipolar resonator shown in FIG. 1, filter circuits designed as quadripolar resonators can also be employed as have been disclosed, particularly, by the aforesaid Kuenenmund patent.

Due to the conditions prescribed in CTD filter circuits like that of FIG. 1, a whole-numbered plurality of CTD elements must always be employed for the closed conductor loop, so that, thus, the line section with the transfer capacitance $C_1$ consists of $n_1$ CTD elements and the line section with the transfer capacitance $C_2$ consists of $n_2$ CTD elements. The self-contained conductor loop, accordingly, has a whole-numbered plurality $n = n_1 + n_2$ of CTD elements. In accord with their line character, filters of this type have periodically repeating pass bands at the frequency $f = af_T/n$ with $a = 0, 1, 2, \ldots$. For narrow band widths B of the pass band, the capacitance ratio of the transfer capacitances is approximately calculated according to the equation $C_2/c_0 \approx 1/\pi B$ for the first pass band which differs from $f=0$.

Figure 2:
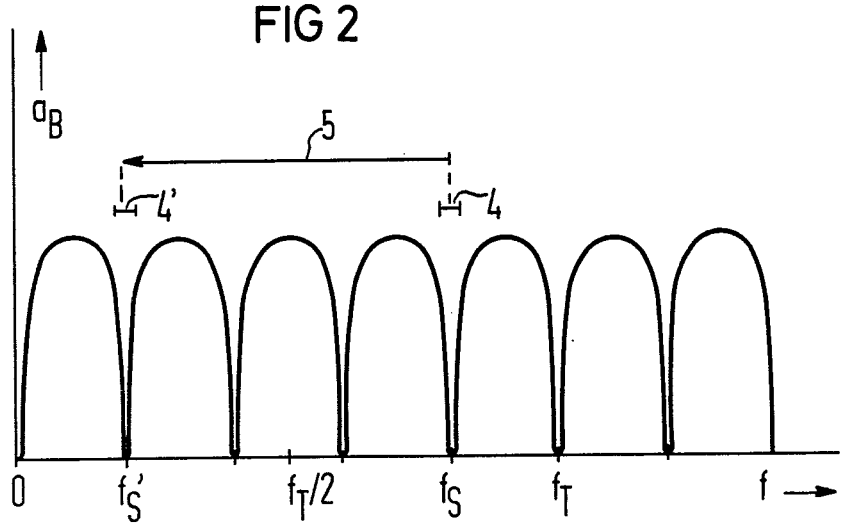
FIG. 2 illustrates the selection of the clock frequency in accordance with the invention, and, thus, a possible application in carrier frequency systems in which, as is known, the frequency position of one of the frequency bands to be transmitted is shifted with the employment of modulators.

In FIG. 2, the attenuation $a_B$ is schematically indicated as a function of the frequency f. It can also be seen that the useful frequency band 4 to be filtered out lies in the range around the signal frequency $f_S$. The arrow 5 shows that, due to a frequency conversion in the sampling, the frequency range 4 at the input of the filter is converted into the frequency range 4' in a frequency position $f_S'$ which at that same time represents the first band pass of the filter which differs from zero. The clock frequency $f_T$ employed for the CTD lines can likewise be seen and the frequency position $f_S$ of the useful frequency band to be filtered out is selected in such manner that $f_S$ is greater than $f_T/2$.

Given carrier frequency systems currently in use and the technological possibilities of realization of such CTD lines, investigations have shown that the present invention is particularly advantageous when the frequency band to be filtered out lies in the range from $f_T/2$ through $3f_T/2$.

As is known, narrow band pass filters must also be provided in carrier frequency systems, said band pass filters serving for the selection of the signals to be transmitted having a frequency position lying beyond the actual speech channel.

The following considerations are also valid by way of example for the dimensioning according to FIG. 2. In all cases in which the frequency band to be filtered out can or may be shifted in its frequency position such as, for example, in the carrier frequency systems of communications technology known per se, there are advantageous resonator dimensionings with a smaller capacitance ratio when one proceeds according to the invention. Thereby, one exploits the peridicity of the resonator attenuation behavior and selects the sampling and, at the same time, the clock frequency $f_T$ in such manner that the frequency band to be filtered out lies in a resonator pass band lying above $f_T/2$. This is illustrated in FIG. 2 on the basis of an example of a ring resonator with $n=5$ ring elements. Thus, in the sampling, the frequency band lying in the frequency range around $f_S$ is shifted down into the frequency position around $f_S' = |f_T - f_S| = f_T/n$ and is filtered out. In this case, the relative band width B' of the filter curve at $f_S'$ is the determining factor for the filter dimensioning and not the band width B related to $f_S$ in the case without frequency conversion ($f_T > 2f_S$):

$$B' = \frac{\Delta f_{3dB}}{f_S} = \frac{\Delta f_{3dB}}{f_T/n} = \frac{\Delta f_{3dB}}{f_S/(n \pm 1)} = B \cdot (n \pm 1)$$

B' is greater than B by the factor $(n \pm 1)$. Therefore, given a circuit with exploited frequency conversion, the capacitance ratios and the chip surface are correspondingly smaller, as is the pass band attenuation component deriving from incomplete charge transfer and the absolute frequency shift of the pass band mean frequency.

Since the structure of suitable filter circuits is known from the prior art patents referred to above, such need not be described in detail. The disclosure of those patents are hereby incorporated herewith.

It will be apparent to those skilled in the art that various modifications or additions may be made without departing from the essential features of novelty of the present invention, which are intended to be defined and secured by the appended claims.

What is claimed is:

1. In an electrical filter circuit for use with a frequency translation system, a plurality of CTD lines, each of said lines having a plurality of charge storage cells, a pulse generator operating at a clock frequency $f_T$ for supplying inputs to said storage cells for moving charges therethrough, one of said CTD lines being connected in a closed loop to form a resonator, and means interconnecting said CTD lines to give each of said CTD lines a unidirectional transmission behavior, said clock frequency $f_T$ being selected so that the frequency to be filtered out by said filter circuit lies between $f_T/2$ and $3f_T/2$, and the frequency to be filtered out is translated to a frequency lying below $f_T/2$.

* * * * *